(12) United States Patent
Vaez-Iravani et al.

(10) Patent No.: US 8,194,240 B1
(45) Date of Patent: Jun. 5, 2012

(54) ENHANCED FOCUSING CAPABILITY ON A SAMPLE USING A SPOT MATRIX

(75) Inventors: Mehdi Vaez-Iravani, Los Gatos, CA (US); Stan Stokowski, Danville, CA (US); Guoheng Zhao, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 547 days.

(21) Appl. No.: 12/042,258

(22) Filed: Mar. 4, 2008

(51) Int. Cl.
*G01B 9/00* (2006.01)
(52) U.S. Cl. .......... 356/124; 356/609; 356/624
(58) Field of Classification Search .......... 356/601, 356/614, 607–609, 624, 123–124; 250/385, 250/586, 458.1, 234, 201.2; 359/368, 383
See application file for complete search history.

(56) References Cited

U.S. PATENT DOCUMENTS

| | | | | |
|---|---|---|---|---|
| 4,022,532 A * | 5/1977 | Montagnino | ................. | 356/513 |
| 5,040,228 A * | 8/1991 | Bose et al. | ................. | 382/141 |
| 5,528,050 A * | 6/1996 | Miller et al. | ................. | 250/585 |
| 5,578,818 A * | 11/1996 | Kain et al. | ................. | 250/234 |
| 5,811,825 A * | 9/1998 | Pryor et al. | ................. | 250/559.21 |
| 5,835,469 A * | 11/1998 | Maeda et al. | ................. | 369/100 |
| 6,388,809 B1 * | 5/2002 | MacAulay | ................. | 359/383 |
| 6,399,942 B1 * | 6/2002 | Ishihara | ................. | 250/234 |
| 6,453,002 B1 * | 9/2002 | Mazor et al. | ................. | 378/49 |
| 6,606,152 B2 * | 8/2003 | Littau et al. | ................. | 356/124 |
| 6,649,893 B2 * | 11/2003 | Fujimoto et al. | ................. | 250/201.2 |
| 7,217,573 B1 * | 5/2007 | Oshida et al. | ................. | 436/94 |
| 7,312,920 B2 * | 12/2007 | Okugawa | ................. | 359/368 |
| 7,693,411 B2 * | 4/2010 | Kwon et al. | ................. | 396/127 |

* cited by examiner

*Primary Examiner* — Sang Nguyen
(74) *Attorney, Agent, or Firm* — Bever, Hoffman & Harms, LLP; Jeanette S. Harms

(57) ABSTRACT

A plurality of spots forming an M×N matrix can be used in a focus system. Specifically, a plurality of identical spots can be simultaneously projected onto the sample. A V(z) curve can be generated for each spot. A robust focus can be determined based on the generated V(z) curves. Using the spot matrix significantly increases the probability that at least one of the plurality of spots in the matrix can provide an unambiguous V(z) curve. Thus, the spot matrix eliminates the need to search for an appropriate site because the spot matrix increases the probability of landing on a "good" location by a factor of M×N.

8 Claims, 2 Drawing Sheets

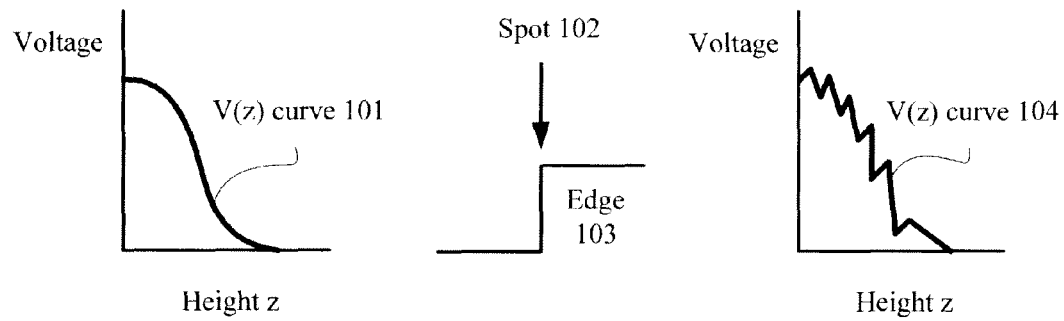
FIG. 1A
Prior Art
FIG. 1B
Prior Art
FIG. 1C
Prior Art
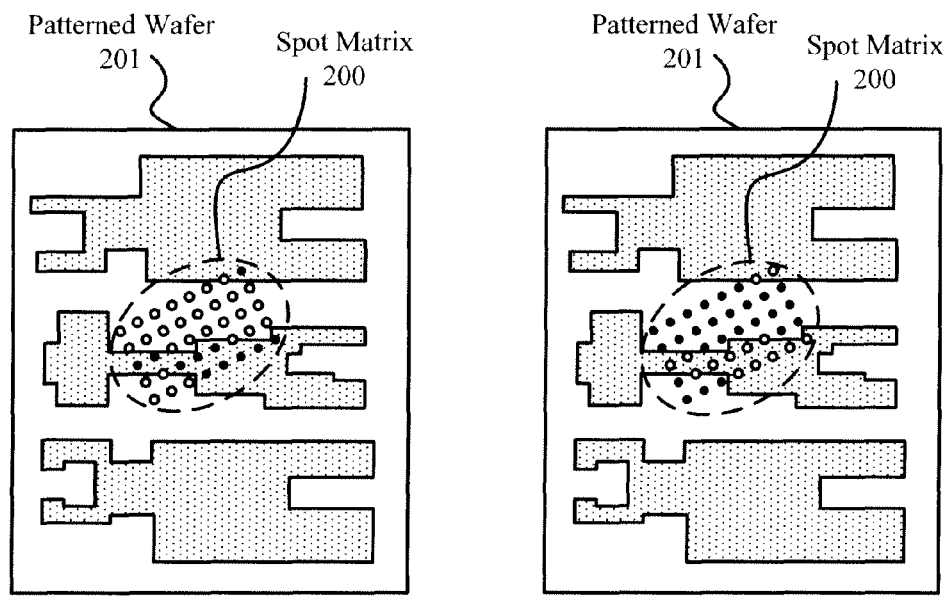
FIG. 2A
FIG. 2B

ENHANCED FOCUSING CAPABILITY ON A SAMPLE USING A SPOT MATRIX

BACKGROUND OF THE INVENTION

1. Field of the Invention

The present invention relates to a focusing tool and in particular to provide a fast, sensitive, and robust technique of performing autofocus in a tool.

2. Related Art

Current technologies for obtaining a good focus in tools include, for example, beam displacement or confocal depth sensing. The beam displacement technique typically used for the mask or wafer (generically referenced herein as a sample) has the undesired property of being confused by the presence of dense patterns on the sample. The confocal technique helps to overcome this problem because of its smaller inherent spot and better focus resolution. In a typical system, a laser generates a collimated beam that is deflected by beam splitter and then focused by an objective lens onto the sample as a single point. In a confocal system, the reflected light from the sample is recollimated into a confocal beam, which is then focused by another lens through a pin hole. Assuming the system is focused, the optical image at the pin hole is identical to that on the sample.

A detector can use this optical image from the confocal beam to generate a V(z) curve of that particular position on the sample, wherein a V(z) graph plots voltage as a function of height z. Note that in a V(z) graph, a maximum voltage corresponds to a maximum amount of light when a spot is focused on the sample. Therefore, by monitoring the maximum voltage, a positional focus can be obtained.

Depending on the type of response obtained, the confocal system either "accepts" the spot on the sample as "valid", or "rejects" the spot and moves on to another location. Note that the term "valid" means that the experimentally obtained V(z) curve is similar to that for a single, edgeless surface. FIG. 1A illustrates an exemplary V(z) curve 101 assuming a single, edgeless surface. Note that each material forming part of the surface of the sample has a unique intensity for its V(z) curve.

When focusing in a dense pattern area, a single beam/spot has a severe limitation in that the V(z) curve is corrupted by edges in the dense pattern. Specifically, the signal from the single beam scatters because of edges or corners in the dense geometry, thereby drastically reducing the quality of the signal. Moreover, a dense geometry will result in interference within a single point, which gives rise to certain fluctuations in the V(z) curve. Thus, any inference drawn about the location of the focal plane using a single beam/spot, particularly when a dense pattern area is being interrogated, is suspect.

For example, if the spot happens to fall on an edge or a corner of a feature or on a defect on the sample, then the response is mildly or even grossly different from an idealized V(z) curve (for the given numerical aperture (NA) of the lens and wavelength). For example, FIG. 1B illustrates a spot 102 that is positioned at an edge 103 of a feature on a sample. FIG. 1C illustrates an exemplary V(z) curve 104 assuming the edge condition shown in FIG. 1B.

This response results in ambiguous information about the exact location of the focal plane. For example, V(z) curve 104 indicates that spot 102 is not focused on either of the two surfaces shown in FIG. 1B. Thus, V(z) curve 104 can be characterized as "non-conformal" to V(z) curve 101.

When the response appears to have been due to the spot position being in a non-ideal location, the general practice is to move to an adjacent location and try again. Because there is no guarantee that the next location will be in a relatively uniform area of the pattern, this repetition is highly inefficient. Logically, this problem becomes more severe for more densely patterned areas of the mask. Indeed, if the level of pattern density exceeds a predetermined amount, it may be impossible to have any reasonable V(z) response in a given location.

In addition, note that the accuracy with which the focal plane can be determined is governed by the available signal to noise ratio, which can vary considerably for different locations. Note that although in theory a signal to noise ratio using a single beam can be improved by simply increasing the laser power, this approach is severely limited in practice. Specifically, increasing the laser power can result in significant sample damage. Moreover, the detector in this system may quickly reach its saturation level using this approach.

Thus, defining what is meant by "focus", even under normal situations and using prevalent techniques, can be a very complicated issue. That is, the definition of focus as a place where the best signal or sharpest response is obtained is predicated on a number of assumptions, any of which can be violated.

Therefore, a need arises for a technique that can determine the focal plane without searching adjacent locations, provide for an enhanced signal to noise ratio, and establish a robust experimental definition of "best focus" regardless of the nature of the sample surface.

SUMMARY OF THE INVENTION

In accordance with one aspect of the invention, a plurality of spots forming an M×N matrix can be used in a focus system. Specifically, a plurality of identical spots can be simultaneously projected onto the sample. A V(z) curve can be generated for each spot. A robust focus can be determined based on the generated V(z) curves.

Advantageously, using the spot matrix significantly increases the probability that at least one of the plurality of spots in the matrix can provide an unambiguous V(z) curve. Thus, the spot matrix eliminates the need to search for an appropriate site because the spot matrix increases the probability of landing on a "good" location by a factor of M×N.

In one embodiment, any non-conformal V(z) curves can be eliminated before determining the robust focus. The robust focus can be defined by the following equation:

$$z_0 = z_j @ \max \left\{ \sum_{i=1}^{i=M \times N} \left[ \frac{V_i(z_i)}{I_i(z_j)} \right] \right\} \begin{array}{l} j = L \\ j = 1 \end{array}$$

where $Z_0$ is a positional height of the robust focus, $Z_j$ identifies the z-position of a spot, L is a number of discrete steps taken to establish the V(z) curve, I is an intensity for the identified spot, and M×N is the number of the plurality of spots.

A system for determining the robust focus can include, by way of example, a diffractive optical element (DOE), an objective lens, a collection lens, and a detector block. The DOE, e.g. a beam splitter, can receive a laser beam and generate a plurality of identical beams. The objective lens can focus the plurality of identical beams as a plurality of identical spots onto a sample and recollimate light reflected by the sample. The collection lens can focus the recollimated light onto a plurality of pinholes. The detector block can capture the signals at the pinholes, generate the V(z) curves for each signal, and determine the robust focus based on the V(z) curves.

BRIEF DESCRIPTION OF THE FIGURES

FIG. 1A illustrates an exemplary V(z) curve assuming a single, edgeless surface.

FIG. 1B illustrates a spot that is positioned at an edge of a feature on a sample.

FIG. 1C illustrates an exemplary V(z) curve assuming the edge condition shown in FIG. 1B.

FIG. 2A illustrates an M×N spot matrix focused on one layer of a patterned wafer.

FIG. 2B illustrates the same spot matrix at the same location, but focused on the substrate of the patterned wafer.

DETAILED DESCRIPTION OF THE FIGURES

Figure 3:
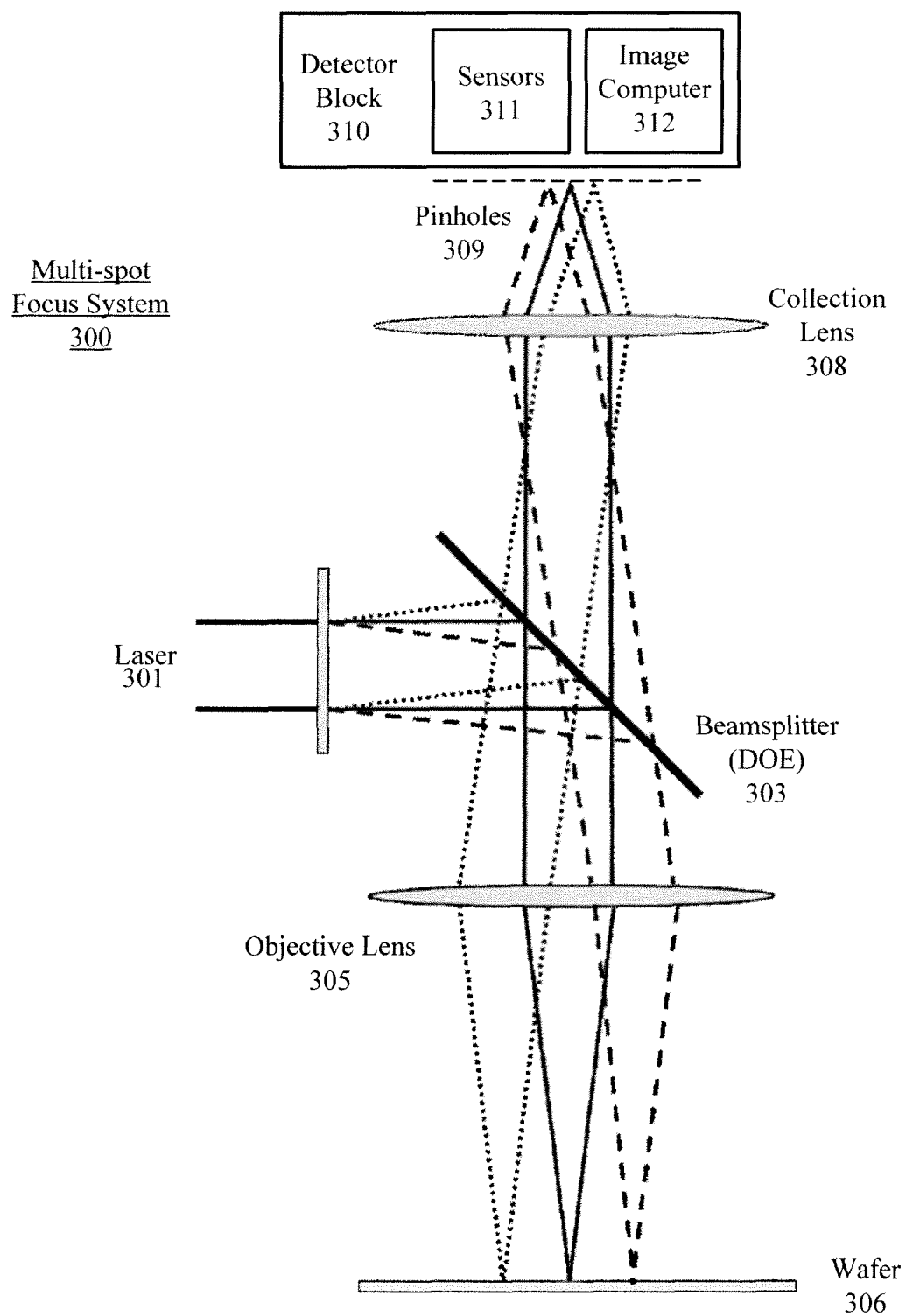
FIG. 3 illustrates an exemplary multi-spot focus system that uses the M×N spot matrix to determine a robust focus.

A typical confocal system uses a single beam, which is converted into a single spot that illuminates a sample. This single spot can be used to generate a V(z) curve. Unfortunately, if the spot is positioned at an edge or corner of a feature or impinges on a defect on the sample, this V(z) curve cannot define the best focus.

To resolve this problem, a plurality of spots forming an M×N matrix can be used. Note that M and N, which can be different or the same integers, can vary depending on the computing resources available in the system (wherein a larger M×N provides a more accurate result, but with an associated cost in the use of system resources). Using a spot matrix significantly increases the probability that at least one of the plurality of spots in the matrix can provide an unambiguous V(z) curve. Thus, the spot matrix eliminates the need to search for an appropriate site because the spot matrix increases the probability of landing on a "good" location by a factor of M×N.

FIG. 2A illustrates an M×N spot matrix 200 focused on one layer of a patterned wafer 201. Specifically, in FIG. 2A, spot matrix 200 is focused on the material forming three features on patterned wafer 201. Note that a focused spot is indicated by a black spot, whereas an unfocused spot is indicated by a white spot. Spots falling on an edge of the features are characterized as unfocused. FIG. 2B illustrates the same spot matrix 200 at the same location, but focused on the substrate of patterned wafer 201.

As explained below in reference to FIG. 3, spot matrix 200 can be generated by a plurality of identical, split beams. These beams effectively form a system of M×N simultaneous confocal microscopes, wherein each beam is able to generate its own V(z) curve.

In one embodiment, the signal dependence on the particular properties of a given position (i.e. whether the pattern is dense or isolated) can be advantageously minimized by normalizing the V(z) signal to the reflectance signal and by averaging multiple normalized V(z) signals. The result is a relatively robust "definition" of what constitutes a focus for a given position in the (x-y) space.

In this embodiment, the following equation can define the robust focus:

$$z_0 = z_j \, @\max \left\{ \sum_{i=1}^{i=M \times N} \left[ \frac{V_i(z_i)}{I_i(z_j)} \right] \right\} \begin{matrix} j = L \\ j = 1 \end{matrix}$$

where $Z_0$ is a height of the robust focus, $Z_j$ identifies the z-position a spot, L is a number of discrete steps taken to establish the V(z) curve, I is an intensity for the identified spot, and M×N is a number of the plurality of spots. In this equation, V(z) is normalized based on intensity to ensure that V is independent of the reflectance of the sample.

Note that with an appropriate choice of pinhole diameter, as is known in the art, the shape of the V(z) curve depends solely on the numerical aperture (NA) of the lenses and the wavelength of light used in the system. Thus, the material of the sample does not affect the shape of the V(z) curve. However, the intensity of the reflected light from the sample is based on the material of the sample.

In another embodiment to determine best focus, after obtaining the V(z) curves, any V(z) curve that does not substantially conform to the expected V(z) curve can be discarded. Any remaining V(z) curves can be used to determine the best focus. Advantageously, in this embodiment, the spot matrix can increase the signal to noise ratio, and hence the accuracy of the best focus. Specifically, by averaging the V(z) signals, the signal to noise ratio generally improves by a factor of approximately Sqrt(M×N).

In one embodiment, to determine whether the spot matrix is focused on a first material or a second material, the system can begin analysis at the edge of the sample (e.g. the wafer). Because the material at the edge of the sample is known, this material becomes a reference focus for other materials. For example, referring back to FIG. 2A, the base layer (e.g. a substrate) could serve as the reference focus for the layer in which the three features are formed.

In another embodiment in which no reference focus is determined, a system could assume that the first-obtained focus is the highest layer (e.g. on patterned wafer 201, the layer in which the three features are formed), the second-obtained focus is the next highest layer, etc.

In yet another embodiment, a CCD camera (see also FIG. 3) can be positioned to capture the images of the sample illuminated by the spot matrix. These captured images can also provide the information on material/layer.

FIG. 3 illustrates one embodiment of a multi-spot focus system 300. System 300 includes a beam splitter (or another equivalent diffractive optical element (DOE)) 303 that creates a plurality of beams from a single beam emitted by laser 301. Splitting the light to form the M×N matrix advantageously eliminates the possibility of sample damage as well as detector saturation. Note that each of the plurality of beams has less intensity than the single beam, but otherwise has identical properties (e.g. shape function) as the single beam. As indicated below, this plurality of identical beams forms the above-described spot matrix on a wafer 306.

A beamsplitter 303 reflects the plurality of beams onto an objective lens 305. Objective lens 305 focuses the plurality of beams to form the spot matrix on wafer 306. Note that after the light from the spot matrix is reflected by wafer 306, some of the reflected light passes back through objective lens 305 to impinge on beamsplitter 303. At this point, the beamsplitter transmits a portion of the light in the form of collimated (and identical) beams to collection lens 308, which in turn focuses the beams through pinholes 309.

A detector block 310 for analyzing the images at pinholes 309 can include an array of sensors 311 (e.g. a 2-D CCD camera, or multi-anode photomultiplier (PMTs)) or M×N light conduits (e.g. fibers) to send the light to discrete detectors. In case of the use of a CCD camera, the individual sensor pixels can act as a pinholes detector, in which case the pinhole array (309) may not be necessary. Using the output from sensors 311, an image computer 312 in detector block 310 can perform the computational aspects of the process (e.g. generating the multiple V(z) curves, determining good V(z) signals, etc.).

The attainment of a proper focus quickly and accurately is very important in many test tools. Furthermore, as the design rules continue to shrink, and the patterns get more and more dense, the definition of "focus" needs to be put on a robust mathematical basis. Multi-spot focus system 300 achieves these objectives in a systematic and relatively inexpensive way.

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent to practitioners skilled in this art.

For example, in one embodiment, a transparent step could be placed in front of half of the pixels in the CCD camera. In this case, half of the pixels are at a different focal position, thereby extending the depth range of the system. Similarly, the plane of the spots could be tilted.

In yet another embodiment, astigmatism could be imposed on the plurality of beams (by the beam splitter). In this embodiment, the resulting spots on one side of a focus have one elliptical orientation, whereas the spots on another side of the focus have an opposite (i.e. perpendicular) elliptical orientation. Therefore, the robust focus can be defined by finding the position where a circle is formed (circle of least confusion).

Accordingly, it is intended that the scope of the invention be defined by the following claims and their equivalents.

The invention claimed is:

1. A method of determining a robust focus, the method comprising:
   simultaneously projecting a plurality of identical spots on a sample;
   generating a V(z) curve for each spot, wherein each V(z) curve plots voltages versus height z; and
   using a detector block, determining the robust focus by averaging multiple normalized V(z) curves.

2. The method of claim 1, further including:
   eliminating any non-conformal V(z) curves before determining the robust focus.

3. The method of claim 1, wherein the robust focus is defined by:

$$z_0 = z_j @ \max \left\{ \sum_{i=1}^{i=M \times N} \left[ \frac{V_i(z_i)}{I_i(z_j)} \right] \right\} \begin{array}{l} j = L \\ j = 1 \end{array}$$

where $Z_0$ is a height of the robust focus, $Z_j$ identifies the z-position of a spot, L is a number of discrete steps taken to establish the V(z) curve, I is an intensity for the identified spot, and M×N is a number of the plurality of spots.

4. The method of claim 1, wherein determining the robust focus by averaging multiple normalized V(z) curves includes normalizing the V(z) curves based on intensity.

5. A system for determining robust focus, the apparatus comprising:
   a diffractive optical element (DOE) for receiving a laser beam and generating a plurality of identical beams;
   an objective lens for focusing the plurality of identical beams as a plurality of identical spots onto a sample and recollimating light reflected by the sample;
   a collection lens for focusing the recollimated light onto a plurality of pinholes; and
   a detector block for capturing a plurality of signals at the plurality of pinholes, generating a plurality of V(z) curves for each signal, and determining the robust focus by averaging multiple normalized V(z) curves, wherein each V(z) curve plots voltages versus height z.

6. The system of claim 5, wherein the detector block further eliminates any non-conformal V(z) curves before determining the robust focus.

7. The system of claim 5, wherein the robust focus is defined by:

$$z_0 = z_j @ \max \left\{ \sum_{i=1}^{i=M \times N} \left[ \frac{V_i(z_i)}{I_i(z_j)} \right] \right\} \begin{array}{l} j = L \\ j = 1 \end{array}$$

where $Z_0$ is a height of the robust focus, $Z_j$ identifies the z-position of a spot, L is a number of discrete steps taken to establish the V(z) curve, I is an intensity for the identified spot, and M×N is a number of the plurality of spots.

8. The system of claim 5, wherein the detector block is configured to normalize the V(z) curves based on intensity.

\* \* \* \* \*